United States Patent
Miller et al.

(10) Patent No.: US 7,443,751 B2
(45) Date of Patent: Oct. 28, 2008

(54) PROGRAMMABLE SENSE AMPLIFIER MULTIPLEXER CIRCUIT WITH DYNAMIC LATCHING MODE

(75) Inventors: Christopher Miller, Underhill, VT (US); Michael Killian, Richmond, VT (US)

(73) Assignee: Qimonda North American Corp., Cary, NC (US)

( * ) Notice: Subject to any disclaimer, the term of this patent is extended or adjusted under 35 U.S.C. 154(b) by 0 days.

(21) Appl. No.: 11/615,118

(22) Filed: Dec. 22, 2006

(65) Prior Publication Data
US 2008/0151647 A1 Jun. 26, 2008

(51) Int. Cl.
*G11C 7/00* (2006.01)
(52) U.S. Cl. .................. 365/205; 365/208; 365/222
(58) Field of Classification Search ........... 365/205
See application file for complete search history.

(56) References Cited
U.S. PATENT DOCUMENTS 5,313,431 A * 5/1994 Uruma et al. ............... 365/205
6,212,110 B1 * 4/2001 Sakamoto et al. ........... 365/190
6,301,173 B2 * 10/2001 Fujioka et al. .............. 365/203
6,580,655 B2 * 6/2003 Jacunski et al. ......... 365/230.03
6,590,819 B1 * 7/2003 Baum et al. ................. 365/203
6,850,454 B2 * 2/2005 Kuge et al. ................. 365/227
2001/0019503 A1 * 9/2001 Ooishi ....................... 365/191
2007/0223296 A1 * 9/2007 Miller et al. ................. 365/208
2007/0247938 A1 * 10/2007 Miller et al. ................. 365/207
2007/0253265 A1 * 11/2007 Miller et al. ................. 365/203

* cited by examiner

*Primary Examiner*—Son L Mai
(74) *Attorney, Agent, or Firm*—Edell, Shapiro & Finnan, LLC

(57) ABSTRACT

Multiplexer control logic is provided for a semiconductor memory device that combines the function of programmable disconnect-state with a dynamic or dynamic latching mode that operates during self-refresh. The programmable disconnect state disconnects the sense amplifier from a memory array segment when it is unselected. When a memory array segment is being accessed, (such as during self-refresh), the multiplexers are latched into a selected state thereby eliminating the multiplexer switching current while the memory array segment is being accessed.

21 Claims, 9 Drawing Sheets

PROGRAMMABLE SENSE AMPLIFIER MULTIPLEXER CIRCUIT WITH DYNAMIC LATCHING MODE

BACKGROUND OF THE INVENTION

The present invention relates to semiconductor memory devices, and in particular dynamic random access memory (DRAM) devices.

In a semiconductor memory device, such as a dynamic random access memory (DRAM) device, a sense amplifier is provided to sense a small potential difference between a reference voltage and voltage on an active bitline pair connected to a memory storage cell in a memory array segment. The sense amplifier amplifies the small difference from which a binary state is determined for the memory storage cell.

In a typical DRAM, the sense amplifier is shared by first and second memory array segments to sense voltage on bitlines to either one memory array segment or the other memory array segment, but never sensing from both memory array segments at the same time. To this end, a first multiplexer is provided that connects a sense node pair of the sense amplifier to, and disconnects the sense node pair from, the first memory array segment. A second multiplexer is provided that connects the sense node pair of the sense amplifier to, and disconnects the sense node pair from, the second memory array segment. Control logic is provided in the memory device to generate multiplexer control signals that control the state of the first and second multiplexers depending on the state of selection signals. The selection signals are derived from control and address signals in order to select the appropriate memory array segments for access.

Certain DRAM devices, such as those targeted for low power consumption applications necessarily have aggressive current specification targets. One known technique to meet these specifications is to force a multiplexer to disconnect a sense amplifier from a memory array having a bitline leakage anomaly when the memory array is unselected. This programmable off-state control prevents wordline-bitline short-circuit current from flowing through the sense amplifier. However, it can also increase operating current of the multiplexer lines by preventing multiplexer lines from being precharged from power supplies before transitioning to a pumped higher voltage level, thus requiring more current from pump source to precharge the sense nodes.

Another power consumption conservation technique is to reduce self-refresh current in a DRAM device by latching the multiplexer state upon activation by a control signal. The multiplexer remains latched in a particular state (and thus cannot be switched to another state) until another control signal activation changes its state. The benefit of this non-dynamic latching technique is that it reduces multiplexer switching current by eliminating the need to reset the multiplexer to a default state. However, the drawback of this technique is that the multiplexer state cannot be programmed to block wordline-to-bitline short-circuit current. Latched states in memory arrays are non-deterministic and result from random address patterns. Sensitivities that arise from different latched state combinations in a memory array cannot be screened-out during manufacturing because the number of state combinations is too large for efficient testing.

What is needed is a control circuit arrangement that combines a programmable off or disconnected state for a multiplexer together with a dynamic latching mode that operates when a memory array segment of a DRAM device is consecutively accessed multiple times for any of a variety of reasons, such as self-refreshing a memory array.

SUMMARY OF THE INVENTION

According to the present invention, multiplexer control logic is provided for a semiconductor memory device that combines the function of programmable disconnect-state with a dynamic latching mode that operates during access of a memory array segment. The programmable disconnect state disconnects the sense amplifier from a memory array segment when that memory array segment is unselected. When a memory array segment is being accessed, such as during self-refresh, the multiplexers are latched into a selected state thereby eliminating the multiplexer switching current during access of the memory array segment.

The multiplexer control logic comprises digital logic that may be broken down into a control block and a driver block. The control block comprises a first control path for the "t" side multiplexer and a second control path for the complementary "b" side multiplexer. Each control path comprises a programmable isolation control circuit, a programmable or dynamic latch control circuit, a pull-up control circuit and a pull-down control circuit. The driver block comprises two driver paths, one for the "t" side multiplexer and another for the "b" side multiplexer. In each driver path there is a pull-up circuit, a pull-down circuit and optionally an intermediate-level circuit.

The control block responds to block select signals, programmable isolation control signals and a latch control signal in order to generate drive state control signals that are coupled to the driver block. The driver block responds to the drive state control signals to generate the appropriate state of first and second multiplexer control signals for controlling first and second complementary multiplexers, respectively.

Thus, control logic for the first and second multiplexers integrates functions in order to account for the programmable isolation status of a memory array segment, the dynamic selection status of a memory array segment and the need to latch the multiplexers during accesses of memory array segments.

DETAILED DESCRIPTION

Figure 1:
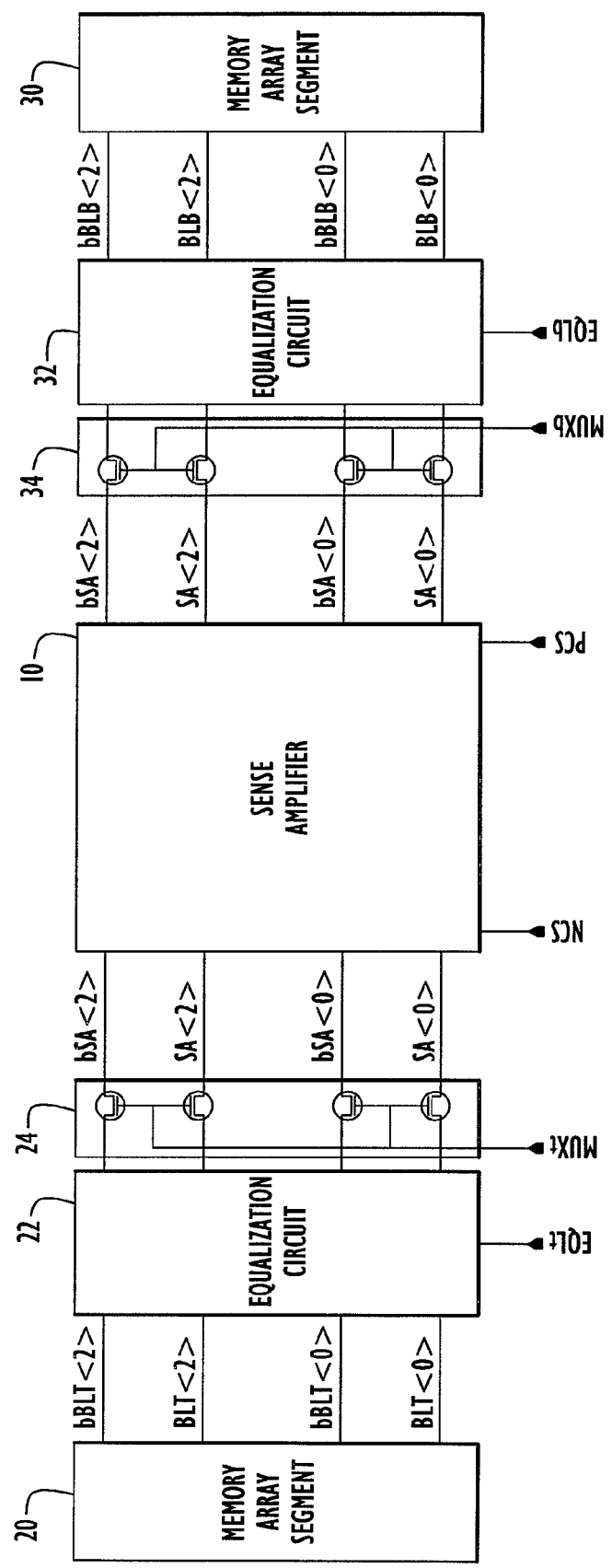
FIG. 1 is block diagram of a conventional sense amplifier configuration used in a semiconductor memory device.

FIG. 1 illustrates a sense amplifier circuit arrangement used in a state-of-the art dynamic random access memory (DRAM) device. A sense amplifier 10 has complementary sense node pairs bSA<2>,SA<2> and bSA<0>,SA<0> that are used to sense and amplify a bitline potential difference in a memory array segment 20 bitline potential in a first memory array segment 20 on a first side ("t" side) or in a memory array segment 30 on a second side ("b" side). On the "t" side of the sense amplifier 10 there is an equalization circuit 22 that connects to the complementary bitline (BL) pairs bBLT<2>, BLT<2> and bBLT<0>,BLT<0> associated with a first memory array segment 20, and a multiplexer circuit 24. In response to an equalization control signal EQLt, the equalization circuit 22 precharges and equalizes voltage on the BL pairs that are associated with the memory array segment 20. Based on the state of a multiplexer control signal MUXt, the multiplexer circuit 24 controls whether the sense amplifier 10 is connected to or disconnected from the BL pairs associated with the memory array segment 20 on the "t" side. Similarly, on the "b" side of the sense amplifier 10 there is an equalization circuit 32 that connects to the complementary BL pairs bBLB<2>,BLB<2> and bBLB<0>,BLB<0>, and a multiplexer circuit 34. In response to an equalization control signal EQLb, the equalization circuit 32 precharges and equalizes voltage on the BL pairs associated a second memory array segment 30. Based on the state of a multiplexer control signal MUXb, the multiplexer circuit 34 controls whether the sense amplifier is connected to or disconnected from the BL pairs associated with the memory array segment 30. It should be understood that in a typical DRAM device, there is a bank of sense amplifiers 10 arranged between banks of memory array segments on opposite sides of the bank of sense amplifiers. The multiplexer circuits 24 and 34 may be more generally referred to herein as switch circuits. The multiplexer circuit 24, in one state, connects the sense amplifier 10 to the memory array segment 20 on the "t" side, and in another state disconnects the sense amplifier 10 from the memory array segment 20. Similarly, the multiplexer circuit 34, in one state, connects the sense amplifier 10 to the memory array segment 30 on the "b" side and in another state disconnects the sense amplifier 10 from the memory array segment 30.

A memory array segment is in a so-called "selected" state is when it is necessary to connect to the sense amplifier for an access, such as a read, write or self-refresh operation. When a sense amplifier is connected to a memory array segment, the sense nodes of the sense amplifier can be equalized from the BLs to which they are connected. An "unselected" state of a memory array segment is when it is not necessary to connect the sense amplifier to the memory array segment for an access, such as a read, write or self-refresh operation.

There are various reasons to isolate or disconnect a sense amplifier from memory array segment. A defect leakage anomaly in the memory array segment, described herein, is one example. Another reason is that in a multi-bank memory architecture it may be desirable to power down or stop refreshing individual banks. In that case, the bitline voltages in the de-powered or non-refreshed bank will drift to random values that can affect operation of adjacent banks. Consequently, a programmable disconnect-state can be used to isolate DC-powered or non-refreshed banks and prevent them from affecting the operation of the actively used banks.

Figure 2:
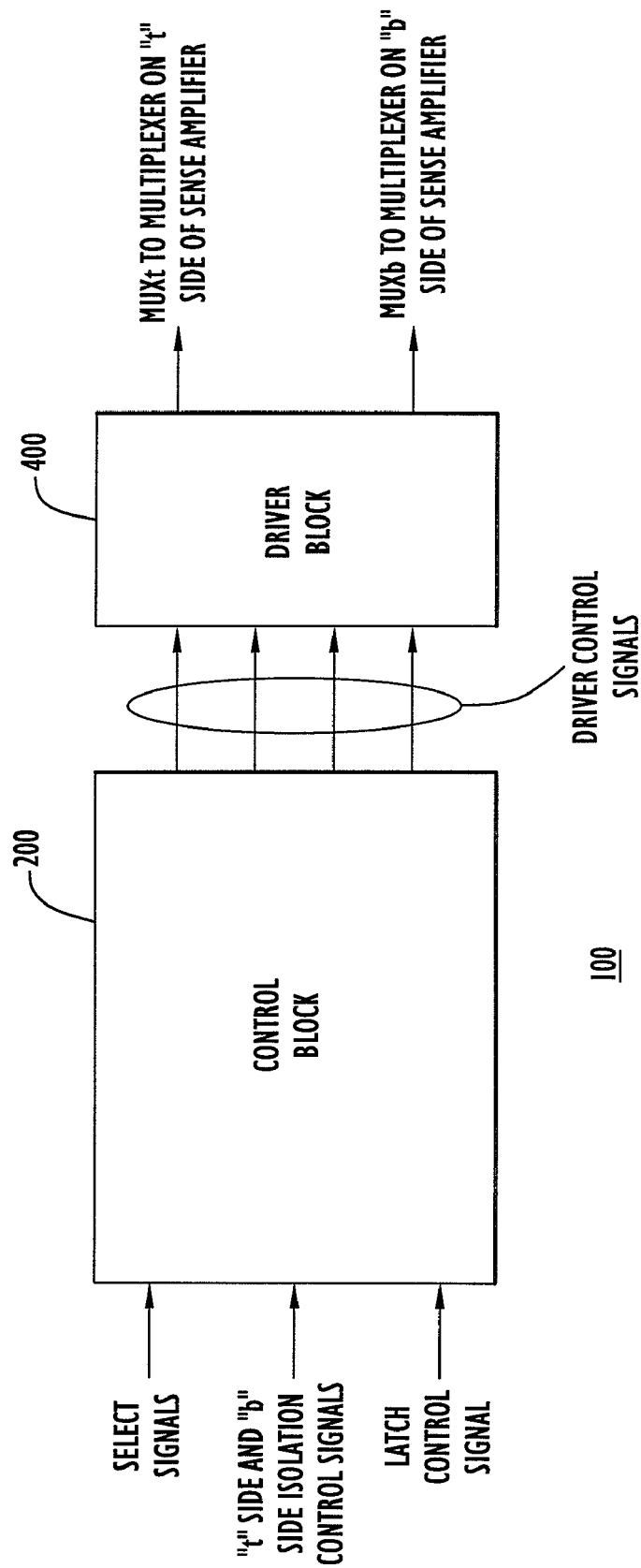
FIG. 2 is a block diagram of the multiplexer control logic according to an embodiment of the present invention.

With reference to FIG. 2, the multiplexer control logic according to an embodiment of the present invention is described. The multiplexer control logic shown generally at reference numeral 100 comprises a control block 200 and a driver block 400 that is connected to the control block 200. The multiplexer control logic 100 supports a programmable multiplexer disconnect (e.g., off) state for isolating a sense amplifier from a memory array segment and a programmable or dynamic latch mode that effectively eliminates multiplexer dynamic switching current when a memory array segment is consecutively accessed multiple times. The control block 200 receives as input block select signals, "t" side and "b" side isolation control signals and a latch control signal. The control block 200 generates driver control signals that are coupled to the driver block 400. The driver block 400 generates the multiplexer control signal MUXt for the multiplexer on the "t" side of a sense amplifier and the multiplexer control signal MUXb for the multiplexer on the "b" side of the sense amplifier.

The multiplexer control logic 100 comprises first and second control paths. The first control path is for the "t" side multiplexer and outputs the MUXt signal and the second control path is for the "b" side multiplexer and outputs the MUXb signal. Each control path contains a control circuit portion and an associated driver circuit portion.

In one embodiment, the driver block 400 comprises devices that drive the corresponding MUXt and MUXb signals to a low level (ground), to an intermediate or precharged level, and devices to drive MUXt and MUXb to a high level. Alternatively, in another embodiment, the driver block 400 comprises only devices to drive to the MUXt and MUXb signals to a low level and to a high level, without any devices to drive to an intermediate level.

In each control path, the control block 200 comprises circuits that control the devices in the driver block 400 as well as circuits to perform the programmable disconnect-state and dynamic latching functions. Signals are also interconnected between the control paths for the "t" side and "b" side to facilitate latching the selected state of the MUXt and MUXb signals when a memory array segment is being accessed.

Figure 3:
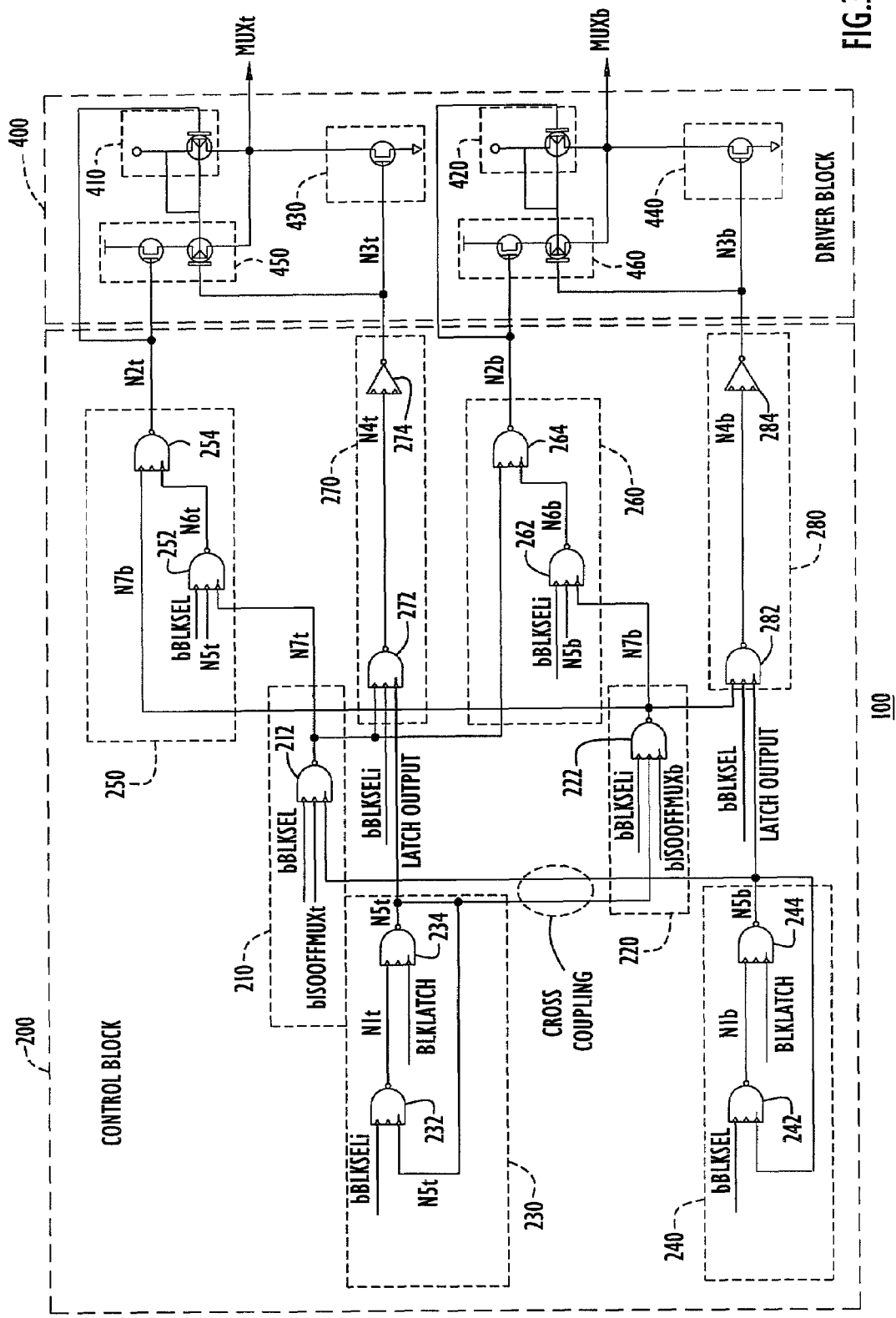
FIG. 3 is a schematic diagram of multiplexer control logic according to an embodiment of the present invention.

Turning to FIG. 3, the multiplexer control logic 100 is described in greater detail. The control block 200 receives as input block select signals bBLKSEL and bBLKSELi, "t" side and "b" side isolation control signals bISOOFFMUXt and bISOOFFMUXb, respectively, and a latch control signal BLKLATCH. The control block 200 is responsive to the block select signals to switch the state (high or low) of the MUXt and MUXb signals when a memory array segment is accessed. The control block 200 is responsive to the isolation control signals to control the programmable disconnect-state and is responsive to the latch control signal to control the dynamic latching modes. Interconnections between the paths of the control block 200 for the "t" side multiplexer and "b" side multiplexer enable latching a selected multiplexer state during an access and retaining the latched state after the access has ended.

As shown in FIG. 3, the control block 200 comprises two programmable disconnect-state (e.g., off-state) control circuits 210 and 220. Programmable disconnect-state control circuit 210 is for the "t" side multiplexer and the programmable disconnect-state control circuit 220 is for the "b" side multiplexer. Similarly, the control block 200 comprises two dynamic latch circuits 230 and 240. Dynamic latch circuit 230 is for the "t" side multiplexer and dynamic latch circuit 240 is for the "b" side multiplexer.

In addition, the control block 200 comprises a pull-up control circuit 250 for the "t" side and a pull-up control circuit 260 for the "b" side. Similarly, the control block 200 comprises pull-down control circuit 270 for the "t" side and a pull-down control circuit 280 for the "b" side.

The programmable disconnect-state control circuit 210 comprises a NAND gate 212 that receives as input the "t" side selection signal bBLKSEL, the "t" side isolation control signal bISOOFFMUXt and an output N5b of the dynamic latch circuit 240. The output N7t of the NAND gate 212 is the output of the programmable disconnect-state control circuit 210 and is connected as an input to the pull-up control circuit 250 and as an input to the pull-down control circuit 270. Likewise, the programmable disconnect-state control circuit 220 comprises a NAND gate 222 that receives as input the "b" side selection signal bBLKSELi, the "b" side isolation control signal bISOOFFMUXb and an output N5t of the dynamic latch circuit 230. The output N7b of NAND gate 214 is the output of the programmable disconnect-state control circuit 220 and is connected as an input to the pull-up control circuit 260 and as an input to the pull-down control circuit 280.

The bBLKSEL and bBLKSELi signals that are coupled to the input of the NAND gates 212 and 222, respectively, may be referred to as complimentary activation control input signals. The "t" side isolation control signal bISOOFFMUXt and "b" side isolation control signal bISOOFFMUXb may be referred to as the "t" side programmable disconnect-state control and "b" side programmable disconnect-state control input signals, respectively.

The dynamic latch circuit 230 comprises NAND gates 232 and 234. Similarly, the dynamic latch circuit 240 comprises NAND gates 242 and 244. The input signals to the dynamic latch circuits 230 and 240 include corresponding ones of the complimentary activation control input signals bBLKSEL and bBLKSELi. That is, bBLKSELi is connected to an input of NAND gate 232 in the "t" side dynamic latch circuit 230 and bBLKSEL is connected to an input of the NAND gate 242 in the "b" side dynamic latch circuit 240. The other input to NAND gate 232 is the output N5t of NAND gate 234. Similarly, the other input to NAND gate 242 is the output N5b of NAND gate 244.

In addition, the dynamic latch circuits 230 and 240 receive as input dynamic latch control input signal BLKLATCH. Specifically, the BLKLATCH signal is connected to one input of NAND gate 234 and to one input of the NAND gate 244.

The pull-up control circuit 250 comprises NAND gates 252 and 254. NAND gate 252 receives as input the bBLKSEL signal, the output N5t of the dynamic latch circuit 230 and the output N7t of the programmable disconnect-state control circuit 210. The output N8t of NAND gate 252 is connected to an input of NAND gate 254. In addition, the output N7b of the programmable disconnect-state circuit 220 is connected to another input of NAND gate 254. The pull-up control circuit 250 generates an output N2t that is connected to the pull-up devices in the "t" side path of the driver block 400.

Similarly, the pull-up control circuit 260 comprises NAND gates 262 and 264. NAND gate 262 receives as input the bBLKSELi signal, the output N5b of the dynamic latch circuit 240 and the output N7b of the programmable disconnect-state circuit 220. The output N8b of NAND gate 262 is connected to an input of NAND gate 264. In addition, the output N7t of the programmable disconnect-state circuit 210 is connected to another input of NAND gate 264. The pull-up control circuit 260 generates an output N2b that is connected to the pull-up devices in the "b" side path of the driver block 400.

The pull-down control circuit 270 comprises a NAND gate 272 and an inverter 274. The inputs to the NAND gate 272 are the bBLKSELi signal, the output N7t of the programmable disconnect-state control circuit 210 and the output N5t of the dynamic latch control circuit 230. The output of the NAND gate 272 is connected to the input of the inverter 274, and the output N3t of the inverter is connected to a pull-down device in the "t" side path of the driver block 400. Likewise, the pull-down control circuit 280 comprises a NAND gate 282 and an inverter 284. The inputs to the NAND gate 282 are the bBLKSEL signal, the output N7b of the programmable disconnect-state control circuit 220 and the output N5b of the dynamic latch control circuit 240. The output of the NAND gate 282 is connected to the input of the inverter 284, and the output N3b of the inverter is connected to a pull-down device in the "b" side path of the driver block 400.

In one embodiment, the driver block 400 comprises pull-up transistor circuits 410 and 420 for the "t" side and "b" side multiplexer control signals MUXt and MUXb, respectively. Likewise, there are pull-down transistor circuits 430 and 440 for the "t" side and "b" side control signals MUXt and MUXb, respectively. In addition, in the event it is desired to have an intermediate drive level on the multiplexers for precharge purposes, there are intermediate level transistor circuits 450 and 460 in the "t" side and "b" side driver paths, respectively. If the intermediate level is not used then the intermediate level transistor circuits 450 and 460 are not utilized. The output signal N3t from pull-down control circuit 270 is connected to the input of the pull-up transistor circuit 410 and the pull-down transistor circuit 420. The pull-up control circuit 250 is not used in that case. Similarly, the output signal N3b from pull-down control circuit 280 is connected to the input of the pull-up transistor circuit 420 and the pull-down transistor circuit 440. The pull-up control circuit 260 is not used in that case.

The input to the pull-down transistor circuit 430 is the output signal N3t from the pull-down control circuit 270 and the input to the pull-down transistor circuit 440 is the output signal N3b of the pull-down control circuit 280.

In one embodiment, the complementary block select signals bBLKSEL and bBLKSELi are active low input signals that control activation of a multiplexer in a "t" side/"b" side multiplexer pair. For example, if bBLKSEL is asserted to an active state (bBLKSEL=0, for example) indicating that the memory array segment on the "b" side is to be accessed, then the MUXb signal is driven to a high level while the MUXt signal is driven to a low level. Conversely, if bBLKSELi is asserted to an active state indicating that the memory array segment on the "t" side is to be accessed, then the MUXt signal is driven to a high level and the MUXb signal is driven to a low level. It should be understood that the active states may be reversed without departing from the spirit and scope of the invention.

Figure 7:
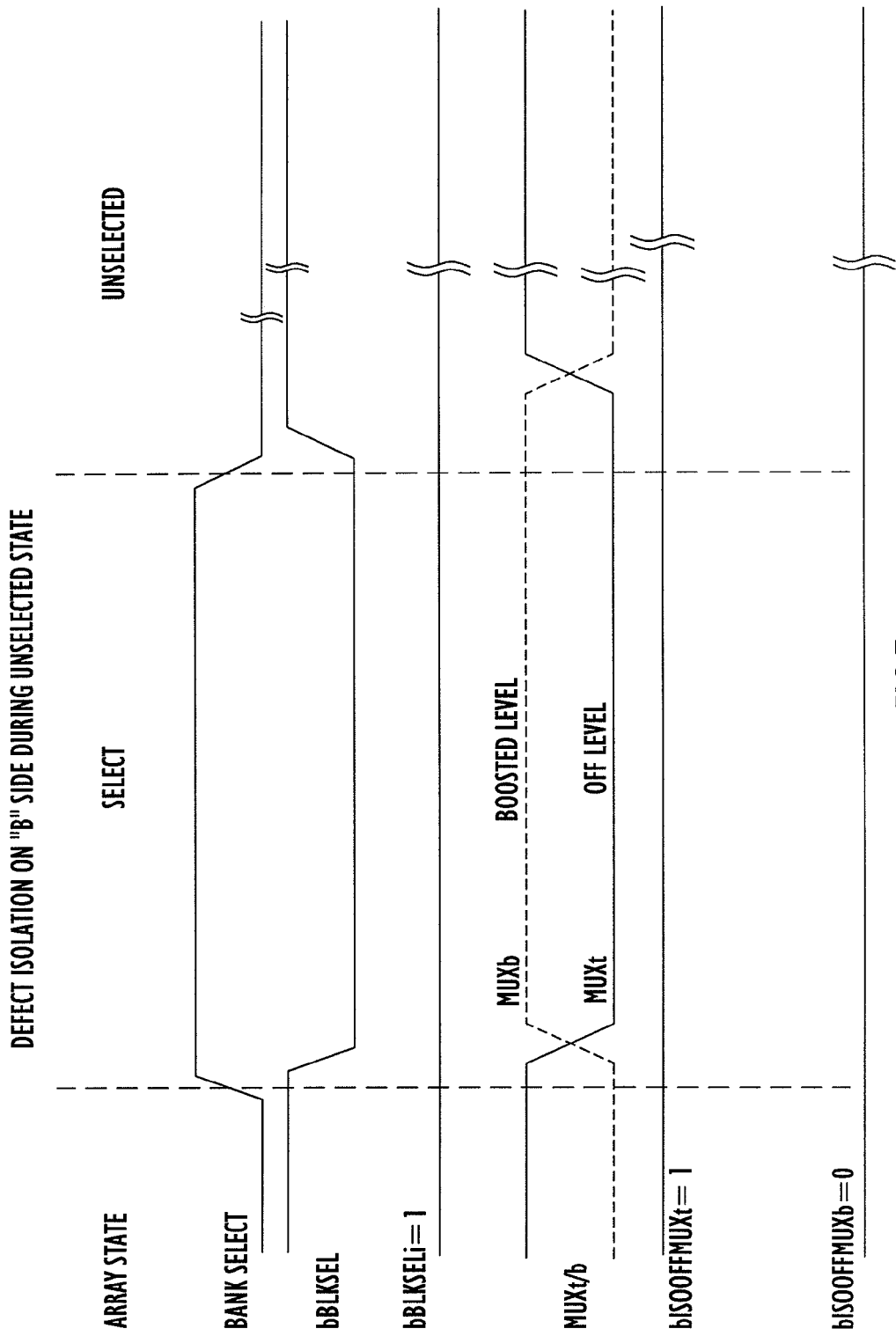
FIG. 7 is a timing diagram depicting a third operational mode of the multiplexer control logic according to one embodiment.

Prior to selection of either the "t" side or "b" side, the pull-up transistor circuit for either the "t" side or "b" side is normally ON such that the initial unselected state is either the intermediate level or the high level state depending on how the pull-up control path is wired and if the programmable disconnected-state for that side is set. In the example schematic shown in FIG. 3, the pull-up path is wired such that the when one of MUXt or MUXb is set to a low level for the unselected state then the other signal (MUXb or MUXt) defaults to a high level for the unselected state. Alternatively, if the neither of the MUXb or MUXt signals is set to a low level for the unselected state then both MUXb and MUXt signals will be at the intermediate level when the memory array segment on the corresponding side is unselected. Defaulting to a high level for an unselected state instead of an intermediate level improves sense amplifier node equalization when transitioning to the unselected state from the selected state where one MUX is returned to the off state for defect isolation and the other MUX returns to a non-isolating unselected state. This is illustrated in FIG. 7, described hereinafter. Thus, when not isolating the sense amplifier from an unselected memory array segment, a multiplexer is controlled to be at least weakly on (intermediate level) if not fully on (high level) when a memory array segment transitions from the selected state to an unselected state. In the case where one side of the sense amplifier needs to be isolated (due to a leakage anomaly on that side of the sense amplifier, for example), the multiplexer on the other side can be controlled to be fully on (high level) in order to help with sense amplifier node precharging even more.

Based on the foregoing, it is evident that the control logic 100 comprises first and second control paths for the first and second multiplexers, respectively. The first control path comprises a programmable disconnect-state circuit 210, a programmable or dynamic latch circuit 230, a pull-up control circuit 250 and a pull-down control circuit 270. Similarly, the second control path comprises a programmable disconnect-state circuit 220, a programmable or dynamic latch circuit 240, a pull-up control circuit 260 and a pull-down control circuit 280. The pull-up control circuits 250 and 260 may more generally be referred to as first drive state control circuits. Similarly, the pull-down control circuits 270 and 280 may be more generally referred to as second drive state control circuits.

The first and second control paths are cross-coupled to each other by the connection the latch output signal N5b from the dynamic latching circuit 240 in the second control path to an input of the NAND gate 212 of the programmable disconnect-state circuit 210 in the first control path. In addition, there is a cross-coupled connection between the output signal N5t from the dynamic latching circuit 230 in the first control path and an input to NAND gate 222 of the programmable disconnect-state circuit 220 in the second control path. The programmable disconnect-state circuit in the first control path controls the first multiplexer to disconnect the sense amplifier from the first memory array segment during an unselected state of the first memory array segment and the dynamic latching circuit in the first control path latches the first and second multiplexers to fixed states during access of the first memory array segment or second memory array segment. Similarly, the programmable disconnect-state circuit in the second control path controls the second multiplexer to disconnect the sense amplifier from the second memory array segment during an unselected state of the second memory array segment and the dynamic latching circuit in the second control path latches the first and second multiplexer to fixed states during access of the first memory array segment or second memory array segment.

A more detailed description of the operation of the control logic 100 follows. In operation, the first drive state control circuit in the first control path generates a first drive state control signal that forces a first drive state circuit in the driver block 400 to put or force the first multiplexer control signal MUXt into a first state. Likewise, the first drive state control circuit in the second control path generates a first drive state control signal that forces another first drive state circuit in the driver block 400 to put or force the second multiplexer control signal MUXb into a first state. In operation, the second drive state control circuit in the first control path generates a second drive state control signal that forces a second drive state circuit in the driver block 400 to put or force the first multiplexer control signal MUXt to a second state. Similarly, the second drive state control circuit in the second control path generates a second drive state control signal that forces another second drive state circuit in the driver block 400 to put or force the second multiplexer control signal MUXb to a second state. It should be further understood that in one embodiment, that the first drive state control signal in each control path may also be used to put or force the respective multiplexer control signal into a third (intermediate) state in the event that a design is used that includes a intermediate state drive circuit in the driver block 400.

Figure 4:
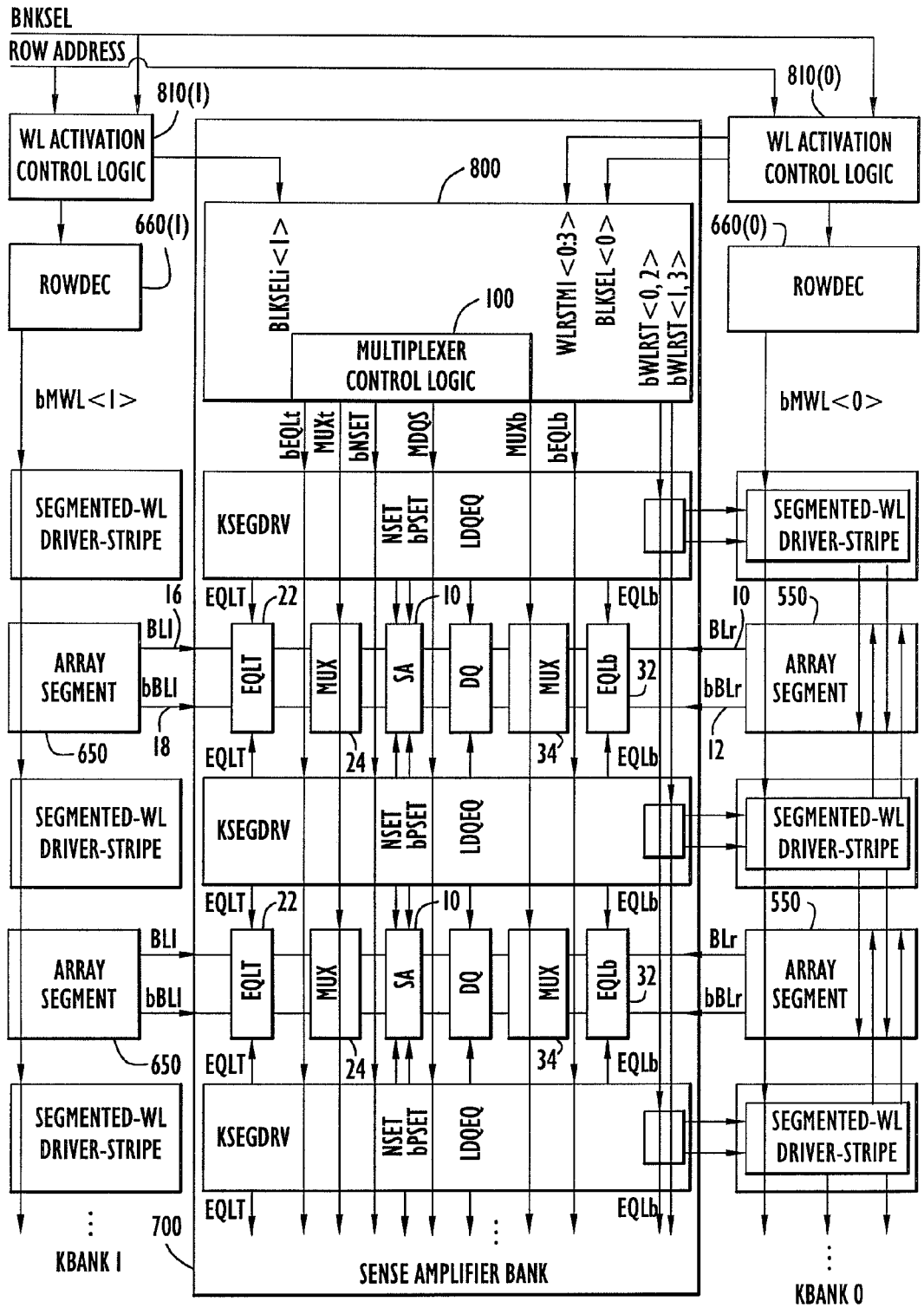
FIG. 4 is a block diagram showing how the multiplexer control logic may be integrated into a DRAM device according to one embodiment.

FIG. 4 illustrates how the multiplexer control logic 100 may be used in a segmented DRAM array having multiple banks, KBank0, KBank1, etc, according to one embodiment. Each bank consisting of a column of memory arrays segments. For example, KBank0 has memory array segments 550 and KBank1 has memory array segments 650. Each memory array segment comprises multiple wordlines (WLs) activated under control of at least one master WL (e.g., bMWL0 for KBank0) and there are memory cells at every other intersection of BL with WL in each memory array segment 550 and 650 as is typical of a folded bitline array architecture.

A DRAM array is typically composed of a multiple of memory array banks, each comprising multiple memory array segments. Each bank comprises its own WL activation control logic block. For example, bank segment KBANK0 comprises multiple memory arrat segments 550 controlled by WL activation control logic 810(0) and bank segment KBANK1 comprises multiple memory array segments 650 controlled by WL activation control logic 810(1), etc.

Access to each memory bank is controlled by a corresponding row decoder (RowDec) 660(i). A sense amplifier bank 700 is positioned between memory banks, with sense amplifiers 10 shared by arrays 550 and 650 on "b" and "t" sides, respectively. The multiplexer 24 connects/disconnects the sense amplifier 10 to/from the memory array segments 650 on the "t" side and the multiplexer 34 connects/disconnects the sense amplifier 10 to/from the memory array segments 550 on the "b" side. A sense amplifier control logic section 800 resides in the sense amplifier bank 700 and the multiplexer control logic 100 resides in the sense amplifier control logic section 800 where it produces the MUXt and MUXb control signals described above.

The multiplexer control logic 100 controls the corresponding multiplexer circuits 24 and 34, respectively, such that the isolation control signals control only the unselected multiplexer output state. That is, the block select signals bBLKSEL and bBLKSELi automatically override the isolate control signal state and bring the output of the multiplexer to the proper selected state, regardless of its starting state. In one embodiment, the bBLKSEL and bBLKSELi signals may be generated in WL activation control logic section 810 along a periphery of an array in the memory device. The block select signals are dependent on which memory bank is to be accessed based on incoming address information. In one embodiment, this is where the logic resides that generates the signals that turn on and off a WL and to control the sense amplifiers that are in a column along the edge of array segments.

The intelligence to keep track of which memory array segments have a BL leakage anomaly is contained in manufacturing programs and databases. A BL leakage anomaly is an array related leakage current that may be due to low resistive path defects (e.g., short-circuits), excessive junction leakage, or other causes. The memory device is interrogated by test equipment and the test results are stored in computer system files and processed off-line by various analysis programs. These programs create a database file that is accessed when a wafer arrives at a fuse programming tool. The database file tells the fuse programming tool on which memory devices and which array segments on the memory device the isolation feature is to be activated.

A bank select signal BNKSEL and row addresses are presented to the WL activation control logic block 810(*i*) of each memory bank for use when a particular memory array bank is to be read from or written to. A portion of the row address determines which memory banks are selected and generates BLKSEL signal(s) to activate at least one bank. The remainder of the row address determines which WL with in an array bank is activated.

Each WL activation control logic 810(*i*) receives a BNKSEL signal and initiates the process of turning on a WL within each memory segment of the memory bank and accordingly activating the sense amplifier control signals when the corresponding BLKSEL signal transitions to an active state.

When the BNKSEL signal to a WL activation control logic 810(*i*) transitions to an active state, the control logic 100 responds by turning off the bitline equalization to the array segments of the bank being accessed and by turning off the multiplexer circuits to the associated array segment of the adjacent bank that is not being accessed. The multiplexer circuits connected to the array segments that are accessed are either turned on or maintained on to connect the BLs of each array segment to the associated sense amplifiers of the shared sense amplifier column.

At the same time the sense amplifier control logic is responding to the BLKSEL signal, the WL activation control logic 810(*i*) decodes the remainder of the row address to select and activate a master wordline (bMWL) and bWLRST signals. The activation of the bMWL and bWLSRST signals will in turn activate a local WL for each memory array segment within the memory bank.

Only one local WL can be activated within each array segment at one time. When this occurs the array cell associated with the WL is connected to a BL of the array segment and its' charge is shared between the capacitance of the BL and the array cell capacitor creating a change in the potential of the connected BL. Because of the arrangement of BL and WL connections in a folded BL architecture, only every other BL is connected by an activated WL to an array cell at a given time. This permits every other BL to serve as a voltage reference to the sense amplifier.

After a sufficient time is allowed for the cell charge to share with the BL capacitance, the control logic 100 generates a bNSET signal which turns on all sense amplifiers 10 in the sense amplifier bank 700. Each sense amplifier 10 then senses a small potential difference between a reference and active BL pair and amplifies the small difference to a binary state. The process of amplification also re-writes the original stored potential back into the array cell after it has been altered by the charge sharing.

When the access to the memory cell is ended, the memory bank and all the array segments within the bank are returned to an unselected state with the dis-assertion of the BNKSEL signal. This causes the turn-off or resetting of all the memory array segments and the sense amplifier control signals in a correct order. First, the bMWL and bMWLRST signals are reset which turns off the WL and disconnects the memory cell from the BL. Next, the sense amplifier signal, bNSET, is reset turning off the sense amplifiers. Finally, the BL equalize signal to the formerly accessed memory array segments is turned back on to reset and restore the BLs while the multiplexer devices are turned on to reconnect the isolated BLs to the sense amplifier. This also allow allows the BL reset and equalization operation to perform the same function on the sense nodes of the sense amplifier. After all this has been completed the memory bank and associated array segments is back to a quiescent unselected state and ready for another memory access.

With reference to FIGS. 5 through 8, with continued reference to FIG. 3, operation of the multiplexer control logic 100 is described. As described above, the inputs to the control block 200 are the complementary block select signals bBLKSEL and bBLKSELi, the block latch signal BLKLATCH and the isolation control signals bISOOFFMUXt and bISOOFFMUXb. When either bISOOFFMUXt or bISOOFFMUXb is asserted to an active low level the associated MUXt or MUXb control signal, respectively, will be at a low level during the unselected state while the opposite MUXb/MUXt signal will be at a high level during the unselected state in this example. The MUXb and MUXt signals can also be at an intermediate state if an intermediate level transistor circuit is used in the pull-up path of the driver block. The output signals N7t and N7b of the programmable disconnect-state control circuits 210 and 220, respectively, determine how the pull-up and pull down paths respond to the programmable isolation control signals bISOOFFMUXt and bISOOFFMUXb, respectively.

Figure 5:
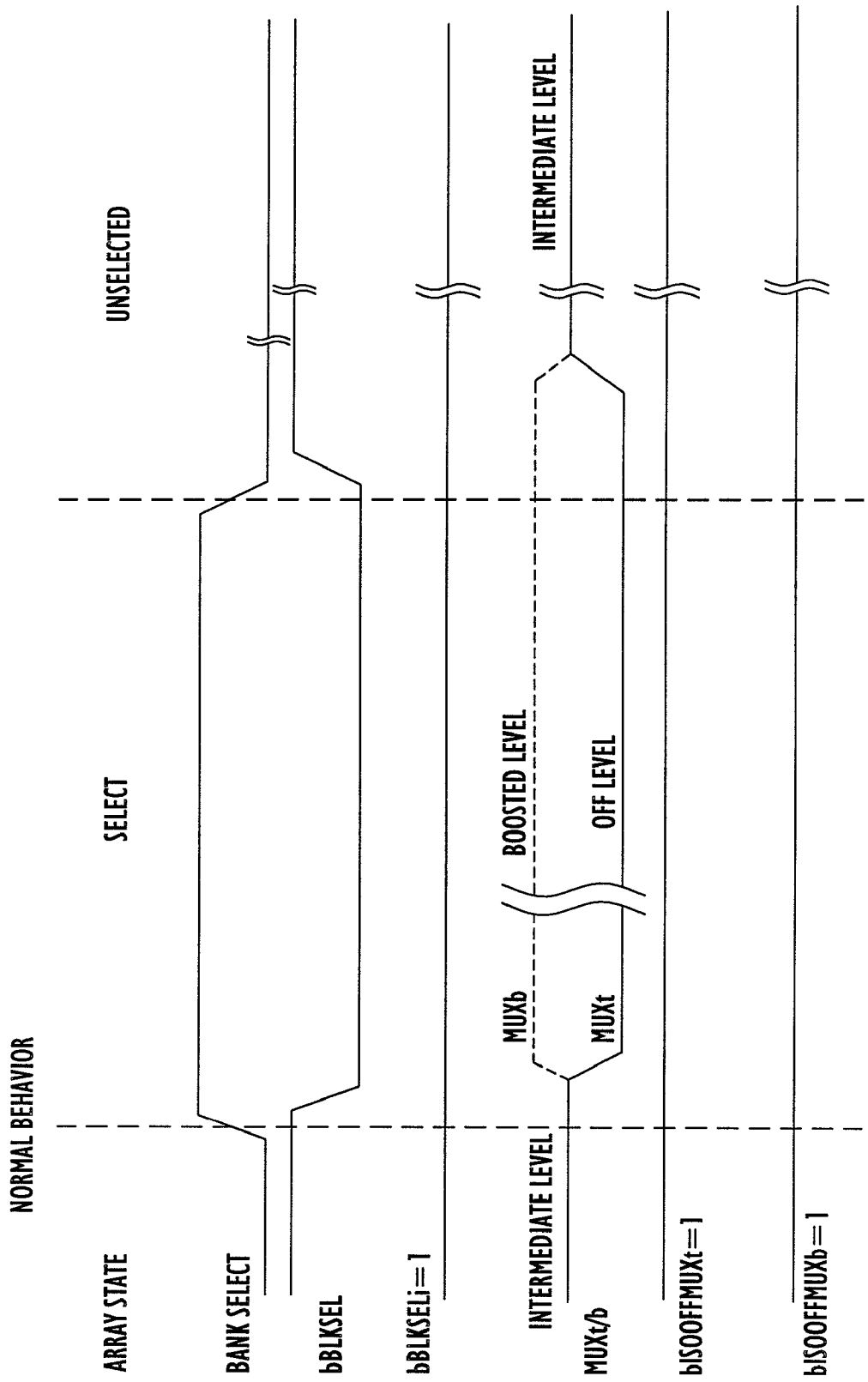
FIG. 5 is a timing diagram depicting a first operational mode of the multiplexer control logic according to one embodiment.

FIG. 5 illustrates a timing diagram for the multiplexer control signals produced by the multiplexer control logic 100 during so-called "normal" behavior when there is no need to invoke the programmable disconnect-state feature. Accordingly, when a memory bank is selected, the Bank Select signal for that bank goes high. Thus, when a memory array segment on the "b" side, for example, is selected for access, bBLKSEL transitions low and bBLKSELi remains high, if an active-low logic is employed. In response, the pull-down control path 270 pulls the MUXt signal low which turns off the multiplexer on the "t" side thereby disconnecting the sense amplifier from the memory array segment on the "t" side. On the other hand, the pull-up control path 260 is responsive to the bBLKSEL going low to cause the MUXb control signal to go high, which in turn causes the multiplexer on the "b" side to connect the sense amplifier to the memory array segment on the "b" side. After the access cycle to the memory array segment on the "b" side is completed, the bBLKSEL signal returns high, so that the MUXt and MUXb signals are returned to an intermediate level, in one embodiment. FIG. 5 does not illustrate the dynamic (programmable) latching mode of operation for the sake of simplicity. However, it should be understood that even when there is no need to invoke the programmable isolation mode of operation the dynamic latching mode may be invoked to "freeze" multiplexer switching during self-refresh of that memory array bank.

Figure 6:
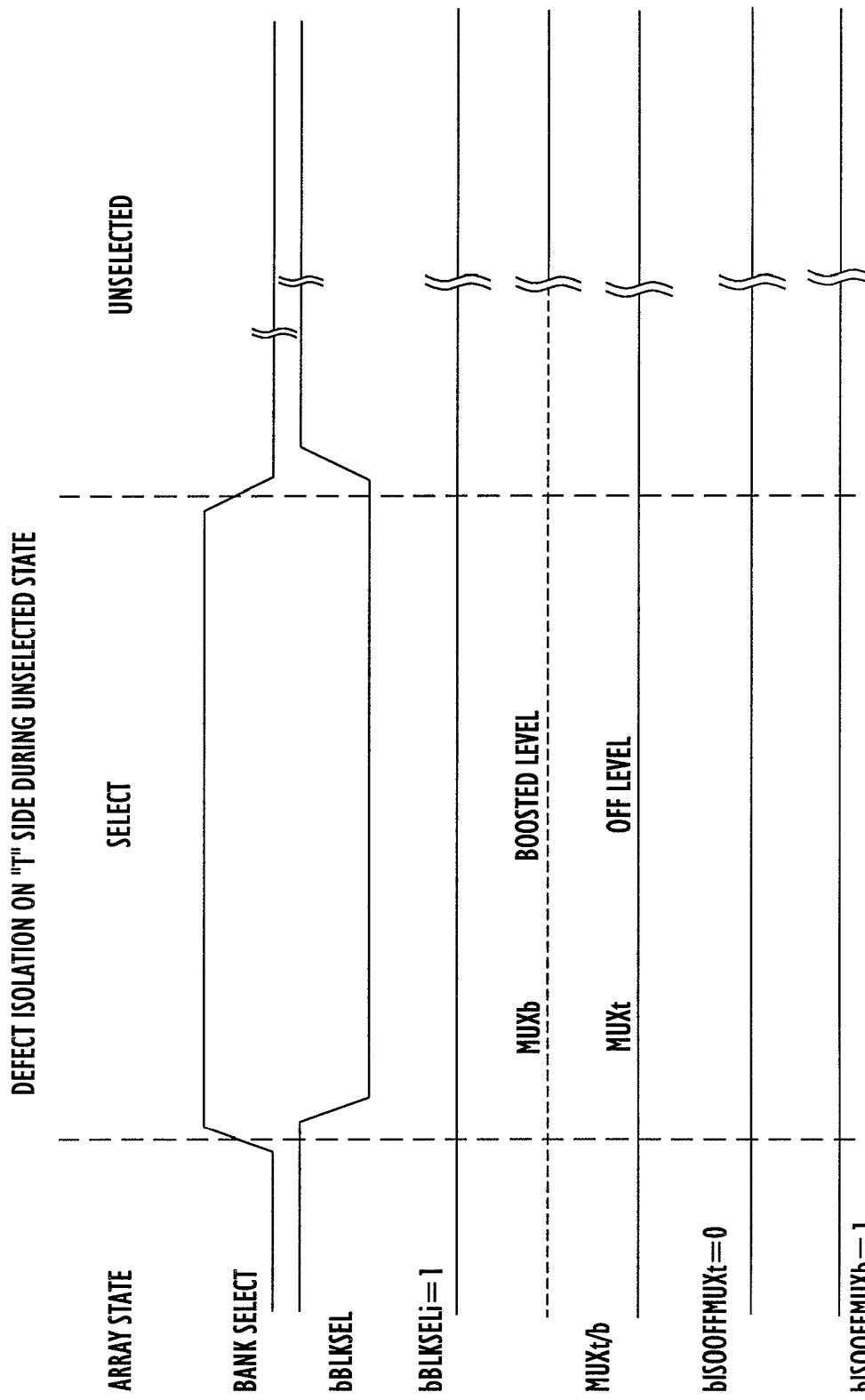
FIG. 6 is a timing diagram depicting a second operational mode of the multiplexer control logic according to one embodiment.

Turning to FIG. 6, operation of the multiplexer control logic 100 is described when there is a reason to isolate the sense amplifier from the memory array segment on the "t" side of the sense amplifier. In this case, the bISOOFFMUXt signal is made active low (bISOOFFMUXt=0), which enables the programmable disconnect-state control circuit 210 whenever the "t" side is unselected so that MUXt stays in a disconnected or off state whenever the memory array segment on the "t" side is unselected. Thus, as shown in FIG. 6, MUXt is low when there is a selection on the "b" side and MUXt is low during an unselected state. However, bISOOFFMUXb stays inactive high (bISOOFFMUXb=1) which disables the programmable disconnect-state control circuit 220 so that the state of MUXb is controlled by either the pull-up transistor circuit 260 or the pull-down transistor circuit 280. Also, signal N7t is forced to a high level by the action of the "t" side isolation control signal bISOOFFMUXt on NAND gate 212. At the same time signal N7b is at a low level forcing signal N6b to a high level. The effect of both signals N6b and N7t being at a high level forces the output of NAND gate 264 to a low state that makes the unselected state of the MUXb signal a high level instead of an intermediate level when the memory bank is in an unselected state.

Referring now to FIG. 7, operation of the multiplexer control logic 100 is described when there is a reason to isolate the sense amplifier from the memory array segment on the "b" side of the sense amplifier. In this case, the bISOOFFMUXb signal is made active low (bISOOFFMUXb=0), which enables the programmable disconnect-state control circuit 200 whenever the "b" side is unselected so that MUXb stays in a disconnected or off state whenever the memory array segment on the "b" side is unselected. FIG. 7 shows that MUXb is low during an unselected state, and goes high only when there is a selection on the "b" side. Thus, if there is a selection on the "t" side, then the MUXb signal would go low. In this example signal N7b is forced to a high level by the action of the "b" side isolation control signal bISOOFFMUXb on NAND gate 222. At the same time signal N7t is at a low level forcing the signal N6t to a high level. The effect of both signals N6t and N7b being at a high level forces the output of NAND gate 254 to a low state that makes the unselected state of the MUXt signal a high level instead of an intermediate level. Having the unselected state of a MUX control signal at a high level improves sense amplifier node precharge and equalization when transitioning to the unselected state from the selected state where one MUX is returned to the disconnected state for defect isolation and the other MUX returns to a non-isolating unselected state.

Figure 8:
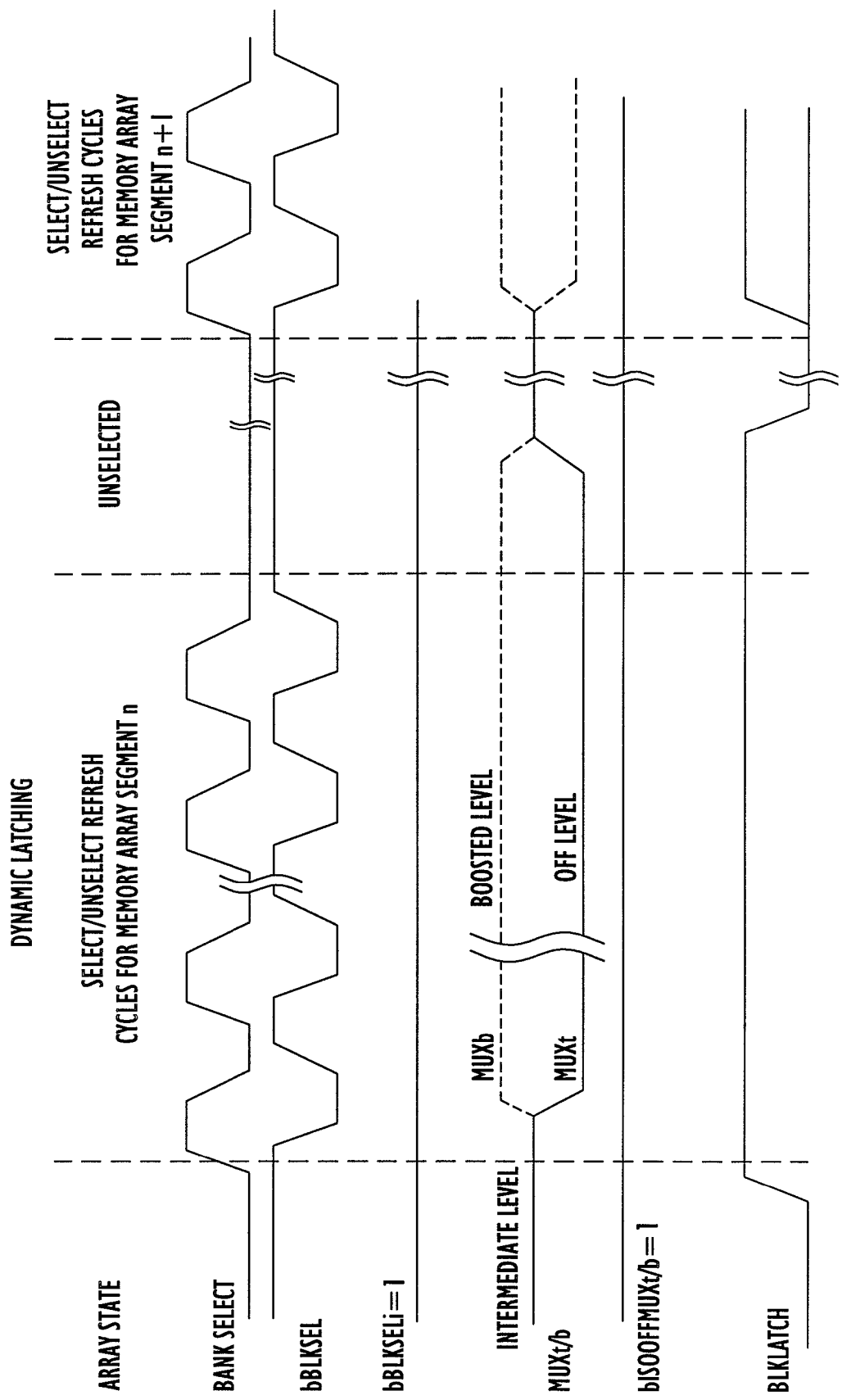
FIG. 8 is a timing diagram depicting a fourth operational mode of the multiplexer control logic according to one embodiment.

Turning to FIG. 8, the dynamic latching feature is described. The dynamic or dynamic latching feature is useful to disable switching of the multiplexers on both sides of the sense amplifier during access of a memory array segment on either side of the sense amplifier, including, but not limited to, when a memory array segment is being self-refreshed. The self-refresh function is one of the distinguishing features of a DRAM device. During self-refresh, the charge to the cells in the memory array segment is refreshed by cycling accesses through each wordline of a memory array segment one at a time. For example, when the self-refresh process is occurring within a memory array segment, the multiplexers on both sides of the memory array segment being accessed can be latched ("frozen") into the selected state (required for accessing a particular memory bank) and they need not be switched to a different state until a new memory bank is to be refreshed. Consequently a significant amount of current associated with switching the multiplexers during self-refresh of a memory array segment can be saved by latching the multiplexers into a particular state during self-refresh of a given memory array segment.

FIG. 8 shows that when a particular memory bank is being self-refreshed, there are typically many toggles of the bBLKSEL signal as the self-refresh process continues from one WL to the next WL within the memory bank. But while the self-refresh is within the memory bank, it is not necessary to toggle the "t" side and "b" side multiplexers. Thus, when the BLKLATCH signal goes high, the multiplexer control logic 100 causes the MUXt and MUXb signals to maintain the state they have during a selection interval (for the memory bank undergoing self-refresh) and keeps the MUXt and MUXb signals in those states even when bBLKSEL goes back to the inactive state (high), until self-refresh for that memory array segment is completed at which time BLKLATCH goes low. Consequently, when there is a selection on the "b" side, MUXb goes high and MUXt goes low as shown in the figure. The MUXt and MUXb signals stay in the selected states even after the bBLKSELi signal returns to an inactive state (high) as long as BLKLATCH is still high as shown in the figure.

More specifically, when the BLKLATCH signal is asserted to an active low state, it causes the MUXt/b states taken during a selection or access (i.e. bBLKSEL or bBLKSELi is asserted to a selected state) to remain latched even after the block select signal bBLKSEL or bBLKSELi returns to its unselected state. The MUXt and MUXb states become latched in each corresponding path of the multiplexer control logic through the latching of the dynamic latch control circuits 230 and 240 that produce the latch outputs N5t and N5b, respectively, as shown in FIG. 3. For example, if the MUXt output transitions to a low level during an array selection because bBLKSEL transitions to the active low state the latching of the MUXb pull-down control path to the off state occurs with the latch output signal N5b transitioning to an active low state and taking over the controlling state to the input to NAND gate 282 in the MUXb pull-down control circuit 280. The latch output signal N5b also takes over the controlling state to the input to NAND gate 262 of the MUXb pull-up control circuit 260 to keep the pull-up path latched in an active or on state. The latch output signal N5b also takes the controlling state of NAND 212 in MUXt to maintain MUXt at a low level through the action of N7t.

Because of the symmetry of the MUXt and MUXb control paths, the same actions take place if activating an array bank where MUXb is driven low instead of MUXt and switching the latch output signal N5t for N5b in the description of operation. In this case if the MUXb signal transitions low during an array selection because bBLKSELi transitions to the active low state, the latch output signal N5t takes over the controlling state to the input to NAND gate 272 in the MUXt pull-down control circuit 270, the NAND gate 252 in the MUXt pull-up control circuit 250, and NAND 222 in the MUXb when the dynamic latch sets.

As shown in FIG. 8, when access (e.g., self-refresh) is completed for a memory bank and access is to be made to (e.g., self-refresh is to be performed on) the next bank, such as memory kbank n+1, MUXt and MUXb signal states must change to that required for accessing the memory kbank n+1. For this to occur the latching control signal, BLKLATCH is disasserted to allow the unlatching of the MUXt and MUXb states associated with memory kbank n and then re-asserted during the initial selection of a wordline in the next memory kbank n+1.

FIGS. 5 and 8 show that the MUXb and MUXt signals are at an intermediate level during precharge states (when neither the "t" side nor "b" side is being selected). This follows from the exemplary schematic diagram shown in FIG. 3, but it is not intended to limit the present invention in any way. It should be understood that there are advantages to returning the MUXt and MUXb signals to an intermediate level during precharge states when there is no need to isolate either side from the sense amplifier when unselected (due to a bitline anomaly). However, it is within the scope and spirit of the present invention to accomplish the various embodiments of the present invention with the MUXt and MUXb signals returning to an active level when neither side is being selected. Indeed, this is evident in FIGS. 6 and 7 that illustrate timing diagrams for the relevant signals when there is a need to isolate the "t" and "b" sides respectively during an unselected state. In those figures, the MUXt and MUXb signals are at an inactive low level whenever both the "t" side and "b" sides are unselected.

Figure 9:
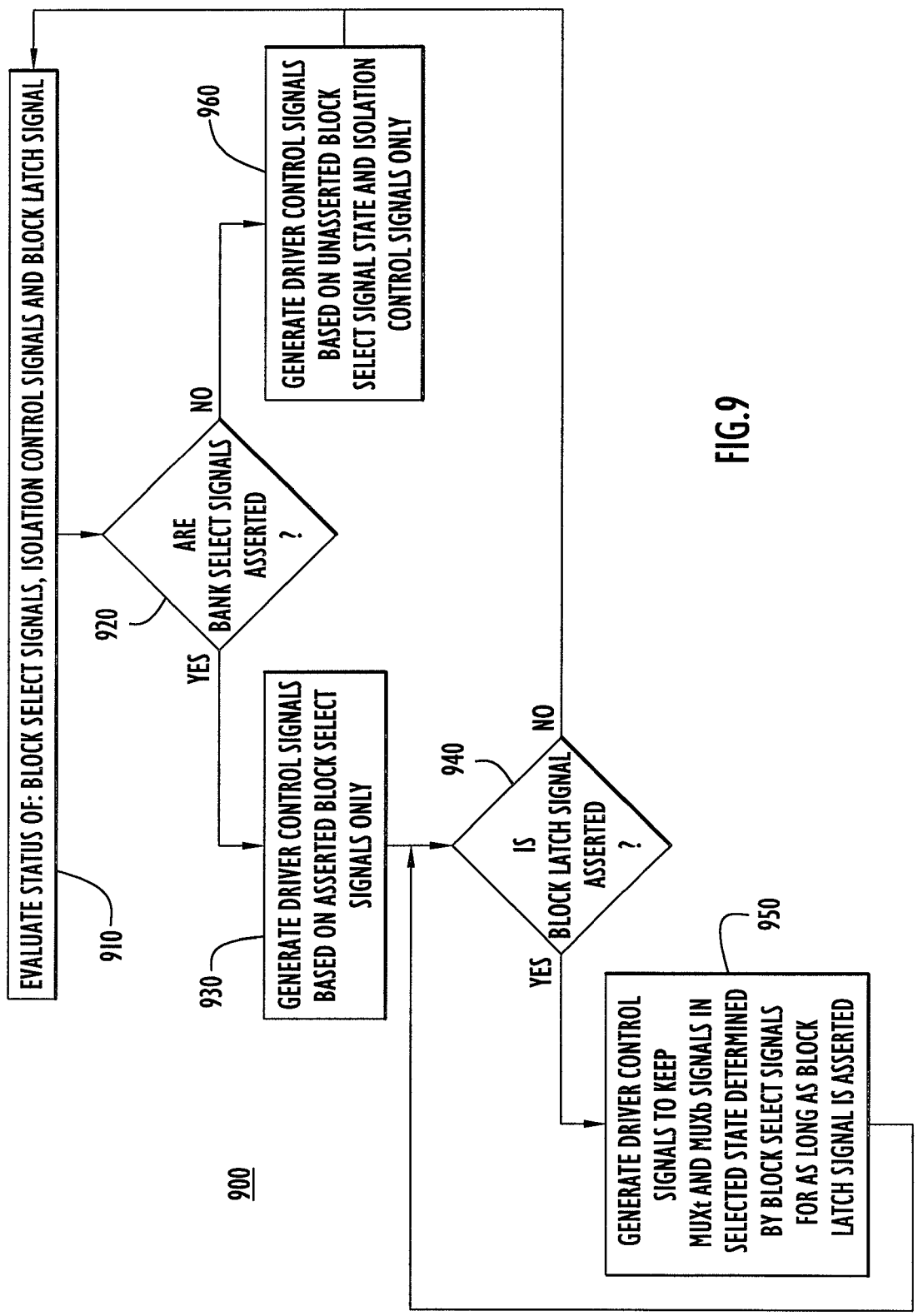
FIG. 9 is a flow chart that generally depicts the multiplexer control techniques according to embodiments of the present invention.

Reference is now made to FIG. 9 for a description of a flow chart that summarizes the control flow 900 for the multiplexer control logic according to the embodiments of the invention. At 910, the control logic 100 evaluates the status of the block select signals, isolation control signals and latch control signal. Any time there is a change in the status of one or more of these signals, there may be a corresponding change in the driver control signals that are supplied to the first and second multiplexers that are positioned between the sense amplifier and first and second memory arrays, respectively. At 920, it is determined whether the any bank select signal is asserted. When a bank select signal is asserted, control flow proceeds to the left branch and when it is not asserted control flow proceeds to the right branch. When a bank select signal is asserted, then at 930, the control logic 100 generates the driver control signals on the basis that of the block select signals only.

Next, at 940, it is determined whether the block latch signal is asserted. If the block latch signal is asserted, then at 950, the control logic generates the driver control signals to put and keep the MUXt and MUXb signals in the state (determined by the status of the block select signals) for as long as the latch control signal is asserted. Thus, the latch control signal will keep the first and second multiplexers latched in that state necessary to avoid multiplexer switching while the first memory array segment or second memory array segment is consecutively accessed multiple times.

Once at 940 it is determined that the block latch signal is not (or is no longer) asserted, then the process returns to 910 for evaluation of the various block select, isolation control and block latch signals.

When at 920, it is determined that there are no bank select signals asserted, then at 960, the control logic 100 generates the driver control signals based on unasserted block select signal state and isolation control signals only.

The system and methods described herein may be embodied in other specific forms without departing from the spirit or essential characteristics thereof. The foregoing embodiments are therefore to be considered in all respects illustrative and not meant to be limiting.

What is claimed is:

1. A method in a semiconductor memory device for controlling connection of a sense amplifier to, and disconnection from, first and second memory array segments, respectively, comprising:
   (a) in a programmable isolation mode, controlling a first switch or a second switch to disconnect the sense amplifier either from the first memory array segment or from the second memory array segment, respectively, when the first memory array or second memory array segment, respectively, is unselected and has a leakage anomaly; and
   (b) in a dynamic latch mode, controlling the first switch and the second switch to be in a fixed state while the first or second memory array segment, respectively, is being accessed when refreshing cells in the first or second memory array segment by cycling accesses through wordlines of the respective memory array segment.

2. The method of claim 1, wherein (a) controlling is responsive to a particular state of a first isolation control signal to isolate the sense amplifier from the first memory array segment when it is unselected, and wherein (a) is responsive to a particular state of a second isolation control signal to isolate the second memory array segment when it is unselected.

3. The method of claim 2, wherein (b) controlling is responsive to a particular state of a latch control signal to cause the first and second switches to each be in a particular state during a time interval when the first memory array segment or the second memory array segment is being accessed.

4. The method of claim 1, and further comprising controlling the first or second switch such that when the first memory array segment and the second memory array segment are unselected and the second memory array has a bitline leakage anomaly, said first switch connects the sense amplifier to the first memory array segment and the second switch disconnects the sense amplifier from the second memory array segment to isolate the sense amplifier from the second memory array segment due to the bitline leakage anomaly in the second memory array segment.

5. A method in a semiconductor memory device for controlling connection of a sense amplifier to, and disconnection from, first and second memory array segments, respectively, comprising:
   a. controlling a first switch or a second switch to disconnect the sense amplifier from the first or second memory array segment, respectively, when the first memory array segment or second memory array segment, respectively, is unselected; and
   b. when both the first memory array segment and the second memory array segment are unselected and said second memory array segment has a bitline leakage anomaly, controlling said first switch to connect the sense amplifier to the first memory array segment and controlling said second switch to disconnect the sense amplifier from the second memory array segment for isolating the sense amplifier from the second memory array segment due to the bitline leakage anomaly in the second memory array segment.

6. A controller for controlling first and second of complementary switch circuits used to connect a sense amplifier to and disconnect a sense amplifier from first and second memory array segments, respectively, of the sense amplifier, the controller comprising:
   a. a control block that receives as input first and second selection signals, first and second isolation control signals and a latch control signal, and comprising a first control path that generates drive state signals for controlling the state of the first switch circuit and a second control path that generates drive state signals for controlling the state of the second switch circuit, wherein the control block is responsive to the first and second selection signals and the first and second isolation control signals, respectively, to generate the drive state signals for the first and second control paths in accordance with a programmable isolation mode to disconnect the sense amplifier from the first memory array segment when the first memory array segment is unselected or to disconnect the sense amplifier from the second memory array segment when the second memory array segment is unselected, and in accordance with a dynamic latch mode to latch the first and second switch circuits to a fixed state during memory access of the first memory array segment or second memory array segment in response to the latch control signal; and
   b. a driver block connected to the control block, wherein the driver block comprises a first set of drive circuits responsive to the drive state control signals from the first control path to generate a first switch control signal that puts the first switch circuit into a first state or a second state, and a second set of drive circuits responsive to the drive state control signals from the second control path to generate a second switch control signal that puts the second switching circuit into a first state or a second state.

7. The controller of claim 6, wherein the first control path comprises a programmable isolation control circuit that is responsive to the first isolation control signal and the first selection signal so that the drive state control signals for the first circuit path cause the first switch circuit to disconnect the sense amplifier from the first memory array segment during an unselected state of the first memory array segment, and wherein the second control path comprises a programmable isolation control circuit that is responsive to the second isolation control signal and the second selection signal so that the drive state control signals for the second circuit path cause the second switch circuit to disconnect the sense amplifier from the second memory array segment during an unselected state of the second memory array segment.

8. The controller of claim 7, wherein the first set of drive circuits comprises a first drive state circuit that puts the first switch control signal into said first state that causes the first switch circuit to be in said first state, and a second drive state circuit that puts the first switch control signal into said second state that causes the first switch circuit to be in said second state, and wherein the second set of drive circuits comprises a first drive state circuit that puts the second switch control signal into said first state that causes the second switch circuit to be in said first state, and a second drive state circuit that puts the second switch control signal into said second state that causes the second switch circuit to be in said second state.

9. The controller of claim 8, and further comprising a third drive state circuit in the first control path that puts the first switch control signal into a third state causing the first switch circuit to weakly connect the sense amplifier to the first memory array segment, and a third drive state circuit in the second control path that puts the second switch control signal into a third state causing the second switch circuit to weakly connect the sense amplifier to the second memory array segment.

10. The controller of claim 8, wherein the first control path in the control block comprises first and second drive state control circuits, wherein the first drive state control circuit in the first control path generates the first drive state control signal that causes the first switch control signal to be in said first state and the second drive state control circuit in the first control path generates the second drive state control signal that causes the first switch control signal to be in said second state, and wherein the second control path in the control block comprises first and second drive state control circuits, wherein the first drive state control circuit in the second control path generates the first drive state control signal in the second control path that causes the second switch control signal to be in said first state and the second drive state control circuit in the second control path generates a the second drive state control signal that causes the second switch control signal to be in said second state.

11. The controller of claim 10, wherein the first control path comprises a first dynamic latch circuit that receives as input the second selection signal and the latch control signal and generates a first latch output signal that is connected as input to the second programmable isolation control circuit and as input to the first drive state control circuit in the first control path, and wherein the second control path comprises a second dynamic latch circuit in the second control path receives as input the first selection signal and the latch control signal and generates a second latch output signal that is connected as input to the first programmable isolation control circuit and as input to the first drive state control circuit in the second control path.

12. The controller of claim 11, wherein the first programmable isolation control circuit is further responsive to the second latch output signal and generates an output signal that is connected as an input to the first drive state control circuit in the first control path and to the first drive state control circuit in the second control path, and wherein the second programmable isolation control circuit is further responsive to the first latch output signal and generates an output that is connected as an input to the first drive state control circuit in the first control path and to the first drive state control circuit in the second control path.

13. The controller of claim 6, wherein the control block controls the first and second sets of drive circuits in the driver block to set one of the first and second switch circuits to a first state and the other of the first and second switch circuits to a second state depending on the first and second isolation control signals.

14. The controller of claim 6, wherein the control block controls the first and second sets of drive circuits in the driver block to set states of the first and second switch circuits to remain unchanged after selection to a memory array segment is complete and a memory array segment becomes unselected while the latch control signal is in a particular state.

15. The controller of claim 6, wherein when the first memory array segment and the second memory array segment are unselected and the second memory array segment has a bitline leakage anomaly, the control block controls said first switch circuit to connect the sense amplifier to the first memory array segment and controls the second switch to disconnect the sense amplifier from the second memory array segment in order to isolate the sense amplifier from the second memory array segment due to the bitline leakage anomaly in the second memory array segment.

16. A controller for first and second complementary switching circuits used to connect a sense amplifier to, and disconnect a sense amplifier from, a first memory array segment and a second memory array segment, respectively, the controller comprising:
　a. first and second control paths for the first and second switching circuits, respectively;
　b. the first control path comprising a programmable isolation control circuit and a dynamic latch circuit, wherein the programmable isolation control circuit in the first control path controls the first switching circuit to disconnect the sense amplifier from the first memory array segment during an unselected state of the first memory array segment and the dynamic latch circuit in the first control path latches the first switching circuit and the second switching circuit to fixed states during access of the first memory array segment or second memory array segment; and
　c. the second control path comprises a programmable isolation control circuit and a dynamic latch circuit, wherein the programmable isolation control circuit controls the second switching circuit to disconnect the sense amplifier from the second memory array segment during an unselected state of the second memory array segment and the dynamic latch circuit in the second control path latches the first switching circuit and the second switching circuit to fixed states during access of the first memory array segment or the second memory array segment.

17. The controller of claim 16, wherein each of the first and second control paths comprise a first drive state circuit and a second drive state circuit, wherein the first drive state circuit in the first control path drives the first switching circuit to at least a first state that connects the sense amplifier to the first memory array segment, and the second drive state circuit in the first control path drives the first switching circuit to a second state that disconnects the sense amplifier from the first memory array segment, and wherein the first drive state circuit in the second control path drives the second switching circuit to at least a first state that connects the sense amplifier to the second memory array segment, and the second drive state circuit in the second control path drives the second switching circuit to a second state that disconnects the sense amplifier from the second memory array segment.

18. The controller of claim 17, wherein the dynamic latch circuit in the first control path receives as input a latch control signal and generates as output a first latch output signal, and the dynamic latch circuit in the second control path receives as input the latch control signal and generates as output a second latch output signal, and wherein the programmable isolation control circuit in the first control path receives as input a first selection signal, a first disconnect programming signal and the second latch output signal, and generates as output a first disconnect state drive signal in response thereto, and wherein the programmable isolation control circuit in the second control path receives as input a second selection signal, a second disconnect programming signal and the first latch output signal and generates as output a second disconnect state drive signal in response thereto.

19. The controller of claim 16, wherein when the first memory array segment and the second memory array segment are unselected and the second memory array segment has a bitline leakage anomaly, the first control path controls said first switching circuit to connect the sense amplifier to the first memory array segment and the second control path controls the second switching circuit to disconnect the sense amplifier from the second memory array segment in order to isolate the sense amplifier from the second memory array segment due to the bitline leakage anomaly in the second memory array segment.

20. A controller for a pair of first and second complementary multiplexers in a semiconductor memory device, comprising:

a. controlling means responsive to selection signals, isolation control signals, and a latch control signal, for generating as output drive state control signals that control the state of first and second multiplexer control signals for the first and second multiplexers, respectively; and b. driving means connected to the controlling means and responsive to the drive state control signals to generate the first and second multiplexer control signals;

c. wherein the controlling means is responsive to the isolation control signals to control the driving means to generate a particular state for the first or second multiplexer control signal that causes the first or second multiplexer, respectively, to disconnect a sense amplifier from a first memory array segment or from a second memory array segment, respectively, and wherein the controlling means is responsive to the latch control signal to control the driving means to generate states for the first and second multiplexer control signals that cause the first and second multiplexers to stay in particular states during self-refresh of the first memory array segment or the second memory array segment, respectively.

21. The method of claim 1, wherein (b) controlling comprises controlling the first switch and second switch to be in the fixed state when cycling accesses through each wordline of the first memory array segment in order to refresh cells in the first memory array segment, and controlling the first switch and second to be in the fixed state when cycling accesses through each wordline of the second memory array segment in order to refresh cells in the second memory array segment.

* * * * *